United States Patent [19]

Frutiger

[11] Patent Number: 5,452,177
[45] Date of Patent: Sep. 19, 1995

[54] ELECTROSTATIC WAFER CLAMP

[75] Inventor: William A. Frutiger, Beverly, Mass.

[73] Assignee: Varian Associates, Inc., Palo Alto, Calif.

[21] Appl. No.: 383,554

[22] Filed: Jan. 31, 1995

Related U.S. Application Data

[63] Continuation of Ser. No. 972,617, Nov. 6, 1992, abandoned, which is a continuation-in-part of Ser. No. 535,384, Jun. 8, 1990, abandoned.

[51] Int. Cl.⁶ .......................................... H02N 13/00
[52] U.S. Cl. .................................. 361/234; 279/128
[58] Field of Search ............ 361/230, 233, 234, 235; 204/192.32, ; 269/DIG. 903; 279/128; 29/829; 156/643

[56] References Cited

U.S. PATENT DOCUMENTS

| | | | |
|---|---|---|---|
| 3,717,801 | 2/1973 | Silverberg | 317/262 E |
| 3,916,270 | 10/1975 | Wachtler et al. | 317/262 E |
| 3,993,509 | 11/1976 | McGinty | 148/1.5 |
| 4,139,051 | 2/1979 | Jones et al. | 165/1 |
| 4,184,188 | 1/1980 | Briglia | 361/234 |
| 4,282,924 | 8/1981 | Faretra | 165/80 E |
| 4,384,918 | 5/1983 | Abe | 156/643 |
| 4,412,133 | 10/1983 | Eckes et al. | 250/492.2 |
| 4,457,359 | 7/1984 | Holden | 165/80 C |
| 4,480,284 | 10/1984 | Tojo et al. | 361/234 |
| 4,502,094 | 2/1985 | Lewin et al. | 361/234 |
| 4,520,421 | 5/1985 | Sakitani et al. | 361/234 |
| 4,535,835 | 8/1985 | Holden | 165/80 R |
| 4,554,611 | 11/1985 | Lewin | 361/234 |
| 4,665,463 | 5/1987 | Ward et al. | 361/234 |
| 4,692,836 | 9/1987 | Suzuki | 361/234 |
| 4,724,510 | 2/1988 | Wicker et al. | 361/234 |
| 4,832,781 | 5/1989 | Mears | 156/345 |
| 4,864,461 | 9/1989 | Kasahara | 361/234 |
| 4,922,099 | 5/1990 | Masuda et al. | 250/324 |
| 5,103,367 | 4/1992 | Horwitz et al. | 361/234 |
| 5,166,856 | 11/1992 | Liporace et al. | 269/903 |
| 5,179,498 | 1/1993 | Hongoh et al. | 361/234 |

FOREIGN PATENT DOCUMENTS

| | | | |
|---|---|---|---|
| 4132239 | 5/1992 | Japan | H01L 21/68 |

OTHER PUBLICATIONS

G. A. Wardly, "Elect. Wafer Chuck for Electron Beam Microfab.", Rev. Sci. Instrum., vol. 44, No. 10, Oct. 1973, pp. 1506–1509.

F. D. Hehre et al., "Electrical Circuits and Machinery", Wiley & Sons, 1942, pp. 150–165.

Primary Examiner—William M. Shoop, Jr.
Assistant Examiner—Richard T. Elms
Attorney, Agent, or Firm—Marilyn Glaubensklee

[57] ABSTRACT

Apparatus for electrostatic clamping of a semiconductor wafer in a vacuum processing chamber wherein an ion beam is applied to the wafer. In a first embodiment, the apparatus includes an electrically conductive platen, a resilient, thermally-conductive dielectric layer affixed to the platen and one or more conductive wires positioned on the clamping surface. A clamping voltage is applied between the wires and the platen to firmly clamp the wafer against the clamping surface and depress the wires into the resilient dielectric layer. In a second embodiment, a three-phase wafer clamping apparatus includes a platen divided into three electrically isolated sections. One phase of a three-phase clamping voltage is connected to each of the platen sections. In the three-phase configuration, the wafer charging current is very small, and the clamping force is essentially constant. In a third embodiment, a six phase wafer clamping apparatus includes a platen having six symmetrically located electrodes. Voltages with six different phases are applied to the electrodes, with the voltages applied to electrodes on opposite sides of the platen being one-half cycle out of phase. The applied voltages are preferably bipolar square waves.

39 Claims, 11 Drawing Sheets

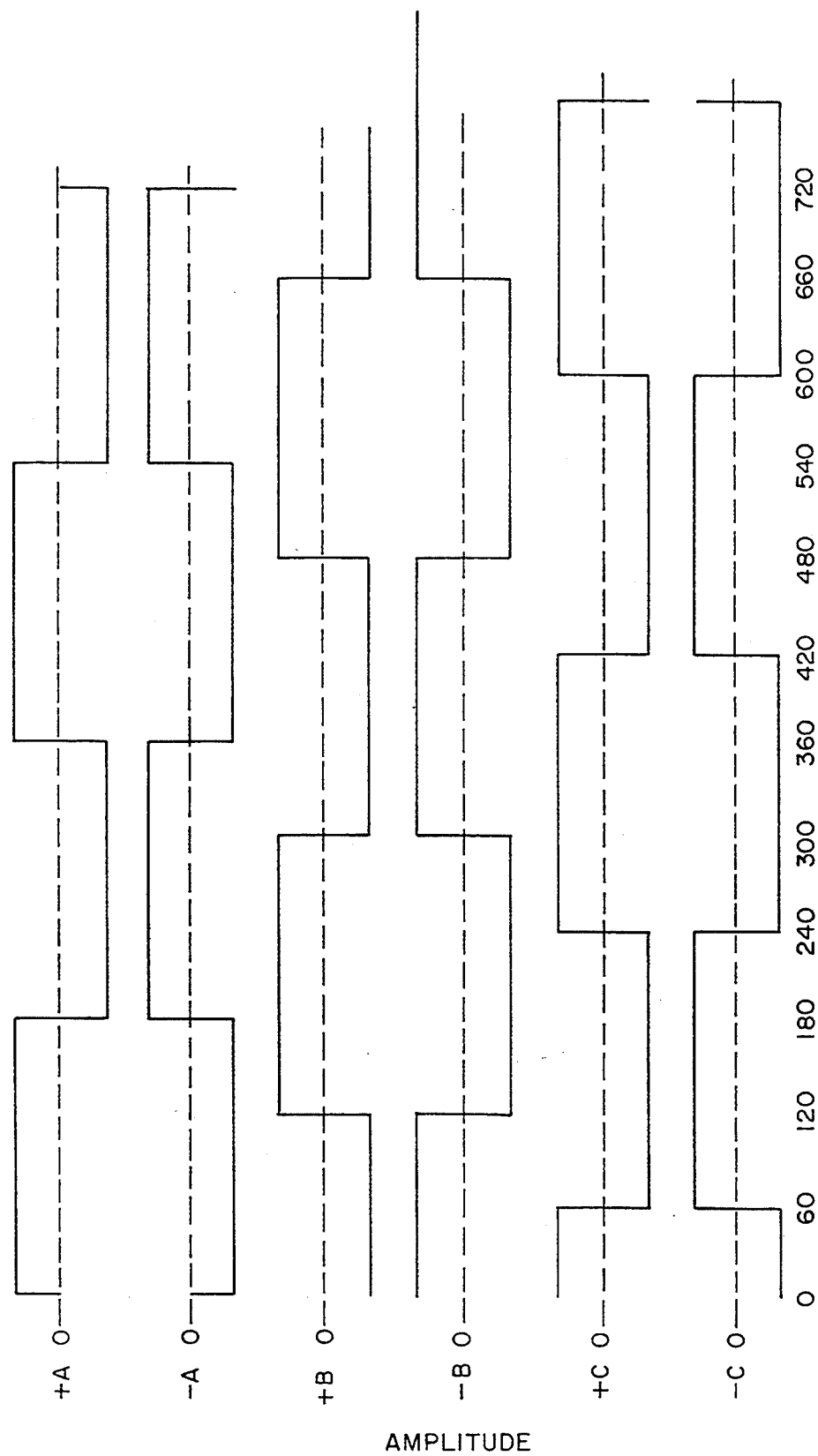

ELECTROSTATIC WAFER CLAMP

CROSS REFERENCE TO RELATED APPLICATION

This is a continuation of Ser. No. 07/972,617 filed Nov. 6, 1992, now abandoned, which is a continuation-in-part of Ser. No. 07/535,384 filed Jun. 8, 1990, now abandoned.

FIELD OF THE INVENTION

This invention relates to apparatus for processing semiconductor wafers and, more particularly, to apparatus for electrostatic clamping of semiconductor wafers in a vacuum processing chamber. The apparatus of the invention is particularly useful in ion implantation systems, but is not limited to such use.

BACKGROUND OF THE INVENTION

In the fabrication of integrated circuits, a number of well-established processes involve the application of ion beams to semiconductor wafers in vacuum. These processes include, for example, ion implantation, ion beam milling and reactive ion etching. In each instance, a beam of ions is generated in a source and is directed with varying degrees of acceleration toward a target wafer. Ion implantation has become a standard technique for introducing conductivity-altering impurities into semiconductor wafers. A desired impurity material is ionized in an ion source, the ions are accelerated to form an ion beam of prescribed energy and the ion beam is directed at the surface of the wafer. The energetic ions in the beam penetrate into the bulk of the semiconductor material and are embedded in the crystalline lattice of the semiconductor material to form a region of desired conductivity.

The target mounting site is a critical part of an ion implantation system. The target mounting site is required to firmly clamp a semiconductor wafer in a fixed position for ion implantation and, in most cases, to provide cooling of the wafer. In addition, means must be provided for exchanging wafers after completion of ion implantation. Cooling of wafers is particularly important in commercial semiconductor processing wherein a major objective is to achieve a high throughput in terms of wafers processed per unit time. One way to achieve high throughput is to use a high current ion beam so that the implantation process is completed in a shorter time. However, large amounts of heat are likely to be generated by the high current ion beam. The heat can result in uncontrolled diffusion of impurities beyond prescribed limits in the wafer and in degradation of patterned photoresist layers. It is usually necessary to provide wafer cooling in order to limit the maximum wafer temperature to about 100° C.

A number of techniques for clamping a semiconductor wafer at the target mounting site are known in the art. According to one well-known technique, the wafer is clamped against a platen by a peripheral clamping ring which engages the outer periphery of the front surface of the wafer. The front surface of the wafer is exposed for ion implantation. However, the outer periphery of the wafer cannot be utilized for integrated circuit devices since the clamping ring blocks ion implantation of that portion of the wafer. Another disadvantage is that peripheral clamping does not result in physical contact between the wafer and a conventional flat metal platen over the entire wafer surface area. Since the wafer does not physically contact a large percentage of the platen surface that is intended for thermal transfer, the rate of thermal transfer from the semiconductor wafer is significantly reduced in a vacuum environment. Heat transfer by radiation from the wafer is inadequate, except for low current ion beams. In the case of high current ion beams, physical contact between the wafer and the platen over the area of the wafer is required to ensure sufficient cooling by conductive thermal transfer.

A variety of techniques have been disclosed for ensuring a high rate of thermal transfer with peripheral clamping. A contoured heat sink surface for optimizing conductive heat transfer between a wafer and a heat sink is disclosed in U.S. Pat. No. 4,535,835, issued Aug. 20, 1985 to Holden. The heat sink surface is contoured so as to impose a load that results in a uniform contact pressure distribution and a stress approaching the elastic limit of the wafer for a peripherally-clamped wafer.

Another prior art technique for thermal transfer in vacuum involves the use of a thermally-conductive polymer between a semiconductor wafer and a heat sink. A tacky, inert polymer film for providing thermal contact between a wafer and a heat sink is disclosed in U.S. Pat. No. 4,139,051, issued Feb. 13, 1979 to Jones et al. The polymer film disclosed by Jones et al has a sticky surface which is used to advantage to retain the wafer in position during processing. Such a sticky surface is unacceptable in automated processing wherein the wafer must easily be removed after ion beam treatment. The sticky surface can result in wafer breakage and can easily become contaminated.

An automated wafer clamping mechanism utilizing a pliable, thermally-conductive layer between a semiconductor wafer and a heat sink is disclosed in U.S. Pat. No. 4,282,924 issued Aug. 11, 1981 to Faretra. The wafer is clamped at its periphery to a convexly-curved platen having a layer of thermally-conductive silicone rubber on its surface.

The technique of gas conduction has also been utilized for wafer cooling in vacuum. Gas is introduced into a cavity or microscopic voids behind a semiconductor wafer and effects thermal coupling between the wafer and a heat sink. Gas-assisted, solid-to-solid thermal transfer with a semiconductor wafer is disclosed in U.S. Pat. No. 4,457,359, issued Jul. 3, 1984 to Holden.

All of the known prior art peripheral clamping techniques result in wasted wafer area. In many of these configurations, thermal transfer is inadequate due to poor contact between the semiconductor wafer and the platen surface. Furthermore, the curved platens disclosed in the aforementioned U.S. Pat. Nos. 4,535,835 and 4,282,924 introduce a variation in the angle of incidence of the ion beam on the wafer surface for different locations on the wafer surface. In ion implantation, variations in incidence angle can be a serious problem. The depth of penetration of incident ions is a function of incidence angle because of the well-known channeling effect. Therefore, it is desirable in ion implantation to provide a constant angle of incidence of the ion beam on the wafer surface over the surface area of the semiconductor wafer.

A wafer clamping technique which eliminates the requirement for a peripheral clamping ring and which permits use of a flat platen surface is centrifugal clamping. In centrifugal clamping, the wafer site is rotated about an axis of rotation. The platen surface is oriented at an angle with respect to the axis of rotation so that centrifugal force presses the wafer against the platen surface. A thermal transfer technique which utilizes centrifugal clamping and a flat platen surface having a pliable, thermally-conductive polymer layer for effecting thermal transfer is disclosed in U.S. Pat. No. 4,832,781, issued May 23, 1989 to Mears. The disclosed technique provides highly satisfactory cooling performance. However, the requirement for rotating the wafer site in order to provide centrifugal clamping adds complexity and is not always practical.

Another known technique for clamping semiconductor wafers involves the use of electrostatic forces. A dielectric layer is positioned between a semiconductor wafer and a conductive support plate. A voltage is applied between the semiconductor wafer and the support plate, and the wafer is clamped against the dielectric layer by electrostatic forces. An electrostatic wafer clamp is disclosed by G. A. Wardly in "Electrostatic Wafer Chuck for Electron Beam Microfabrication", *Rev. Sci. Instrum.*, Vol. 44, No. 10, Oct. 1972, pp. 1506–1509 and in U.S. Pat. No. 3,993,509 issued Nov. 23, 1976 to McGinty. Electrostatic wafer clamp arrangements which utilize a thermally-conductive material to remove heat from the wafer are disclosed in U.S. Pat. No. 4,502,094, issued Feb. 26, 1985 to Lewin et al, U.S. Pat. No. 4,665,463, issued May 12, 1987 to Ward et al and U.S. Pat. No. 4,184,188, issued Jan. 15, 1980 to Briglia. The Briglia patent discloses a support plate having layers of thermally-conductive, electrically-insulative RTV silicone. Electrostatic wafer clamps are also disclosed in U.S. Pat. No. 4,480,284, issued Oct. 30, 1984 to Tojo et al, U.S. Pat. No. 4,554,611, issued Nov. 19, 1985 to Lewin, U.S. Pat. No. 4,724,510, issued Feb. 9, 1988 to Wicker et al and U.S. Pat. No. 4,412,133, issued Oct. 25, 1983 to Eckes et al.

U.S. Pat. No. 4,520,421, issued May 28, 1985 to Sakitani et al, discloses a specimen supporting device including a pair of specimen attracting portions each having an electrode on the lower surface of an insulating member. When a voltage is applied between the pair of specimen attracting portions, the specimen is electrostatically attracted to the upper surface. The voltage can be AC or DC. An embodiment having eight arcuate specimen attracting portions with voltages of alternately opposite polarities is disclosed.

U.S. Pat. No. 5,103,367, issued Apr. 7, 1972 to Horowitz et al, discloses an electrostatic chuck for semiconductor wafers having at least three electrodes. Two of the electrodes embedded in a dielectric film are energized by an AC supply to provide sine wave fields of controlled amplitude and phase. The relative phases and amplitudes of the electrode voltages are adjusted to null the voltage induced on the surface of the wafer. In one embodiment, the substrate support surface comprises a thin ceramic layer such as sapphire ($Al_2O_3$).

Problems associated with prior art electrostatic wafer clamping arrangements include inadequate clamping force, damage to devices on the wafer by charging currents, difficulty in making electrical contact to the semiconductor wafer, and wafer sticking to the platen after the clamping voltage has been removed. In addition, thermal transfer characteristics have usually been inadequate for high current ion implantation applications, since a significant portion of the platen surface area is devoted to making electrical contact with the semiconductor wafer. See, for example, the aforementioned U.S. Pat. No. 4,502,094.

It is a general object of the present invention to provide improved methods and apparatus for electrostatic clamping of workpieces to a support surface.

It is another object of the present invention to provide improved methods and apparatus for electrostatic semiconductor wafer clamping.

It is another object of the present invention to provide electrostatic clamping apparatus that is highly reliable in clamping semiconductor wafers.

It is a further object of the present invention to provide electrostatic wafer clamping apparatus which provides highly efficient thermal transfer to or from a semiconductor wafer.

It is yet another object of the present invention to provide electrostatic wafer clamping apparatus which includes means for effectively cooling a semiconductor wafer during processing in vacuum so as to permit a relatively high level of incident energy.

It a further object of the present invention to provide electrostatic wafer clamping apparatus which avoids damage to devices on a semiconductor wafer by charging currents.

It is still another object of the present invention to provide electrostatic clamping apparatus having a wafer clamping surface which substantially avoids wafer sticking.

It is still another object of the present invention to provide electrostatic wafer clamping apparatus wherein the wafer is released when the clamping voltage is turned off.

It is a further object of the present invention to provide apparatus for clamping a semiconductor wafer wherein the entire wafer surface is exposed at the same angle for processing.

It is still another object of the present invention to provide electrostatic wafer clamping apparatus which is simple in construction and low in cost.

SUMMARY OF THE INVENTION

According to the present invention, these and other objects and advantages are achieved in apparatus for electrostatic clamping of a workpiece. The workpiece is typically a semiconductor wafer, and the apparatus is typically utilized in a vacuum processing chamber wherein a beam, such as an ion beam, is applied to the wafer. The apparatus comprises a platen including at least two platen sections and means for applying AC clamping voltages with different phases to the platen sections. The platen sections include conductive electrodes which are electrically isolated from each other. A dielectric material disposed on each of the electrodes defines a clamping surface for receiving a wafer. One phase of the clamping voltage is applied to each of the electrodes such that the wafer is firmly clamped against the clamping surface by electrostatic force.

Preferably, the apparatus for electrostatic clamping of a workpiece comprises a platen having an electrically insulating clamping surface for receiving a workpiece and 2n conductive electrodes, where n is an integer equal to or greater than two, underlying and electrically isolated from the clamping surface, and clamping control means for applying an AC voltage to each of the electrodes when clamping of the workpiece is desired. The electrodes are symmetrically disposed with respect to the center of the clamping surface. The voltages applied to electrodes on opposite sides of the platen are one-half cycle out of phase. The workpiece is electrostatically clamped in a fixed position on the clamping surface when the AC voltages are applied to the electrodes.

In a preferred embodiment, the platen includes six electrodes, and clamping voltages having six phases are applied to the electrodes. Preferably, the clamping surface is circular and is radially divided into six sectors, with one of the electrodes underlying each of the sectors of the clamping surface. The clamping surface is defined by dielectric insulators, and the electrodes comprise metal layers formed on the lower surfaces of the dielectric insulators. The dielectric insulators are preferably non-polarizing so that the clamping force is nearly zero when the AC voltages are removed from the electrodes. In a preferred embodiment, the dielectric material comprises alumina, sapphire or aluminum nitride.

The voltage applied to each of the electrodes preferably comprises a bipolar square wave halving a fundamental frequency in the range of 20 Hz to 50 Hz and an amplitude in the range of 900 volts to 1200 volts peak. The means for applying an AC voltage to each of the electrodes preferably comprises means for generating bipolar square wave voltages having phases of 0°, 60°, 120°, 180°, 240° and 300° for application to the six electrodes. The voltages applied to the electrodes have equal amplitudes and frequencies but different phases. The square wave clamping voltages insure that a clamping force is applied to the workpiece at all times, thereby preventing vibration of the workpiece.

In the preferred embodiment, the platen further includes an insulating substrate for supporting the electrodes and the dielectric insulators and a support plate for the insulating substrate. The platen can include a grounding ring for connecting the workpiece to ground potential.

When the electrostatic clamping apparatus is utilized in a vacuum chamber, the apparatus preferably includes means for introducing a gas into a region between the workpiece and the clamping surface for conducting thermal energy between the workpiece and the clamping surface. To prevent escape of gas from the region, the apparatus preferably includes means for sealing the region between the workpiece and the clamping surface near an outer periphery thereof. In addition, the apparatus preferably includes means for cooling the platen. The platen can be cooled by providing a passage in the support plate for circulation of a cooling liquid.

BRIEF DESCRIPTION OF THE DRAWINGS

For a better understanding of the present invention, together with other and further objects, advantages and capabilities thereof, reference is made to the accompanying drawings which are incorporated herein by reference and in which:

FIG. 14B is a timing diagram that illustrates the six voltage waveforms generated by the clamping control circuit of FIG. 14A;

DETAILED DESCRIPTION OF THE INVENTION

Figure 1:
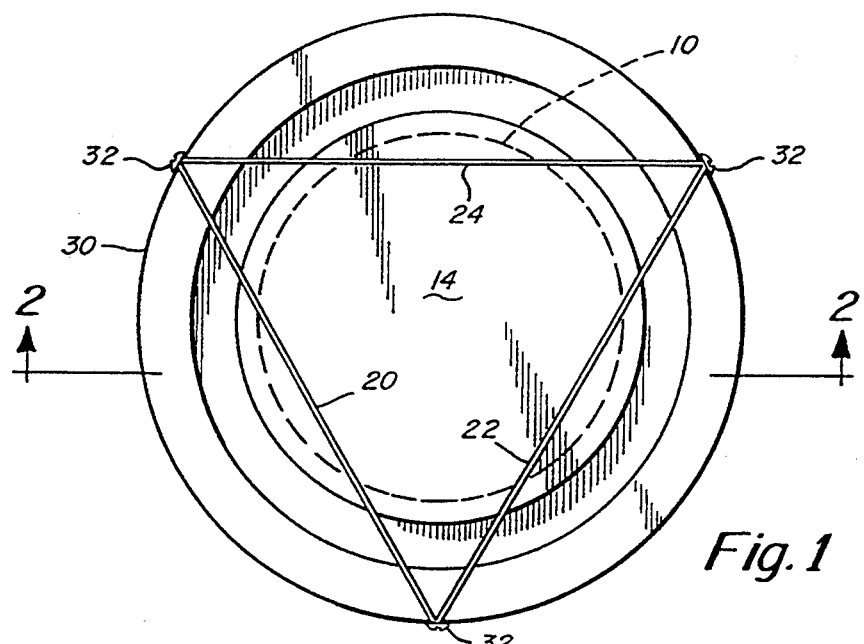
FIG. 1 is a schematic plan view of electrostatic wafer clamping apparatus having contact wires positioned on the clamping surface.
Figure 2:
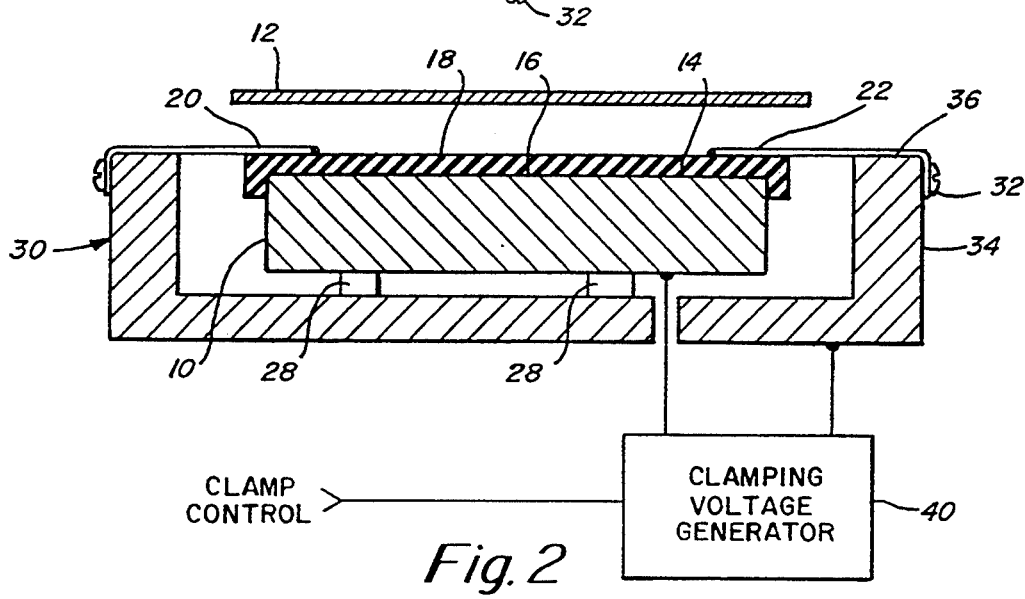
FIG. 2 is a cross-sectional view of the wafer clamping apparatus of FIG. 1 with a semiconductor wafer positioned above the clamping surface.
Figure 3:
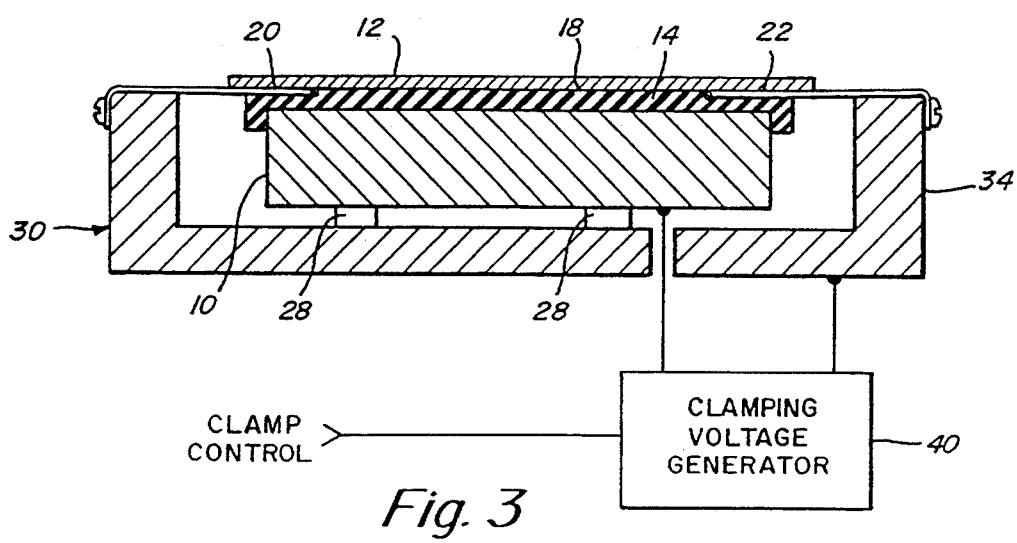
FIG. 3 is a cross-sectional view of the wafer clamping apparatus of FIG. 1 with a semiconductor wafer positioned on the clamping surface.

Apparatus for electrostatic clamping of a semiconductor wafer in accordance with a first embodiment of the present invention is shown in simplified form in FIGS. 1–3. An electrically conductive platen 10 provides mechanical support for a semiconductor wafer 12. The platen 10 is typically an aluminum disk and may be provided with passages (not shown) for circulation of a cooling fluid. A dielectric layer 14 is affixed to a surface 16 of platen 10. The surface 16 is typically flat. The dielectric layer 14 has a flat wafer clamping surface 18. The dielectric layer 14 is a soft, resilient material and is preferably a thermally-conductive dielectric material, as described in detail hereinafter.

Conductive wires 20, 22 and 24 are lightly stretched across clamping surface 18 and are attached to a frame member 30. The wires 20, 22 and 24 lie generally in the plane of clamping surface 18 and protrude at least slightly above clamping surface 18. The wires 20, 22 and 24 can be secured to frame member 30 by suitable connection means such as screws 32 to ensure electrical contact with frame member 30. The platen 10 is electrically isolated from frame member 30 by appropriate insulating means such as insulating standoffs 28.

In the embodiment of FIGS. 1–3, the frame member 30 is cup-shaped and has an upstanding wall 34 which surrounds platen 10. The wires 20, 22, 24 are stretched across a top surface 36 of wall 34. The top surface 36 of wall 34 is located relative to clamping surface 18 such that wires 20, 22 and 24 are positioned on clamping surface 18. A clamping voltage generator 40 has an output connected between platen 10 and frame member 30. A clamp control signal controls the operation of clamping voltage generator 40. When the clamp control signal is in an active state, a clamping voltage, as described hereinafter, is applied between platen 10 and wires 20, 22 and 24.

The wafer 12 can be positioned on clamping surface 18 by any suitable wafer handling system. The wafer 12 is shown in FIG. 2 positioned above clamping surface 18 and is shown in FIG. 3 clamped to surface 18. In a preferred wafer handling system, the wafer 12 is placed by a wafer pick on three wafer support pins (not shown) which extend through platen 10 and dielectric layer 14. The pins are then retracted into platen 10 so that the wafer 12 is lowered onto the clamping surface 18. A wafer handling mechanism of this type is disclosed in U.S. Pat. No. 4,817,556, issued Apr. 4, 1989 to Mears et al.

When the wafer 12 has been positioned on the clamping surface 18 of dielectric layer 14, the clamping voltage generator 40 is activated, causing the application of a clamping voltage between wires 20, 22, 24 and platen 10. As shown in FIG. 2, the wires 20, 22 and 24 protrude at least slightly above clamping surface 18 except when the wafer 12 is firmly clamped in position. The wires 20, 22 and 24 electrically contact wafer 12 along at least portions of their length. When the clamping voltage is applied, the wafer 12 is drawn firmly against clamping surface 18 by electrostatic forces, and the wires 20, 22 and 24 are pressed into the resilient dielectric layer 14. The wafer 12, the platen 10 and the dielectric layer 14 form a parallel plate capacitor. It is well known that application of a voltage between the plates of a parallel plate capacitor produces an electrostatic force which attracts the plates toward each other.

The dielectric layer 14 is a preferably soft, thermally-conductive polymer layer having a thin, hard surface film. The soft polymer layer, which is preferably a silicone rubber containing thermally-conductive particles, conforms to surface irregularities on the wafer and has low thermal resistance. The surface film is preferably silicon dioxide which prevents adherence, both of the wafer and of foreign matter, to the silicone rubber layer. The silicone rubber layer preferably has a thickness in the range of about 0.003 inch to 0.010 inch and may be molded in place on the surface of platen 10. Further details regarding the silicone rubber layer and techniques for fabrication thereof are provided in the aforementioned U.S. Pat. No. 4,832,781, which is hereby incorporated by reference. The silicone rubber layer is extremely soft and typically has a hardness of durometer value 50 shore A or less.

The soft, silicone rubber layer is used to advantage in providing a secure and low-resistance electrical contact to semiconductor wafer 12. The wires 20, 22 and 24 are formed of an electrical conductor which is relatively strong and is resistant to oxidation. A preferred material is tungsten. Other suitable materials include molybdenum and noble metals such as gold and platinum. The wire diameter is typically in the range of about 0.0008 inch to 0.003 inch. A preferred wire diameter is about 0.001 inch. The wire diameter must be sufficiently large to carry the charging current associated with operation of the wafer clamp. In addition, the wire diameter must be sufficient to ensure durability during multiple clamping operations. However, the wire diameter must not be so great that it damages the dielectric layer 14 or degrades its thermal performance.

Figure 4A:
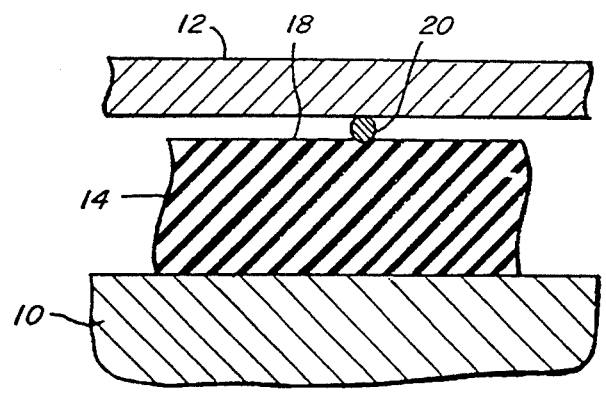
FIG. 4A is an enlarged, partial cross-sectional view of the wafer, the thermally-conductive dielectric layer and the conductive platen, showing the contact wire protruding above the clamping surface.

The thin wires 20, 22 and 24 provide line contacts with wafer 12. It has been found that point contacts do not provide a reliable, low-resistance contact to the wafer, as required for automated semiconductor processing. Furthermore, the resilient dielectric layer 14 assists in maintaining a low resistance contact with wafer 12. When the wafer 12 is first positioned on clamping surface 18 and no clamping voltage is applied, the wires 20, 22 and 24 protrude at least slightly above clamping surface 18, as shown in FIG. 4A. Thus, the wires 20, 22 and 24 physically contact the wafer 12, at least along a portion of their lengths.

When the clamping voltage generator 40 is activated and the clamping voltage is applied, the wafer 12 is drawn against clamping surface 18, thereby pressing wires 20, 22 and 24 into resilient dielectric layer 14 and maintaining or increasing the length of electrical contact between wires 20, 22 and 24 and wafer 12. The resilience of dielectric layer 14 urges wires 20, 22 and 24 against wafer 12 to ensure that a reliable, low resistance contact is maintained. The line contact between wires 20, 22 and 24 and wafer 12 ensures initial contact when only the weight of the wafer 12 is available to provide the contacting force, in spite of the bulk resistance surface oxides and unipolar effects of surface doping of the wafer.

Figure 4B:
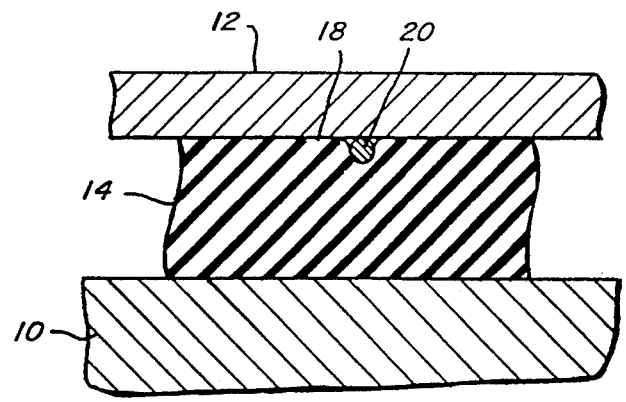
FIG. 4B is an enlarged, partial cross-sectional view of the wafer, the thermally-conductive dielectric layer and the conductive platen, showing the contact wire pressed into the dielectric layer.

An enlarged, partial cross-sectional view of wafer 12, dielectric layer 14 and platen 10 is shown in FIG. 4B. The wafer 12 is shown in the clamped position. It is seen that the wire 20 is pressed into the resilient dielectric layer 14. The wafer 12 is not significantly deformed by the wire 20, and contact is maintained between wafer 12 and clamping surface 18 except for a very small region that is approximately equal in width to the diameter of wire 20. The soft, resilient layer 14 is believed to flow up and around wire 20 rather than forming a depression in which contact is not maintained between wafer 12 and clamping surface 18. The configuration shown in FIG. 4B has been confirmed using an optically-transparent, conductively-coated glass wafer. In order to achieve the configuration shown in FIG. 4B and described above, the ratio between the wire diameter and the thickness of dielectric layer 14 is preferably in the range of about 0.10 to 0.33.

The configuration shown in FIG. 1 utilizes three wires 20, 22 and 24 for establishing electrical contact with wafer 12. This configuration was utilized in the example of FIG. 1 to provide clearance for a wafer lift mechanism (not shown) located in the center portion of platen 10. However, any combination of one or more conductive strands or wires positioned on clamping surface 18 are included within the scope of the present invention. It will be understood that a single contact wire provides a line contact with wafer 12. As the number of contact wires is increased, the resistance of the electrical contact to wafer 12 is decreased and the clamping force in increased.

Figure 5:
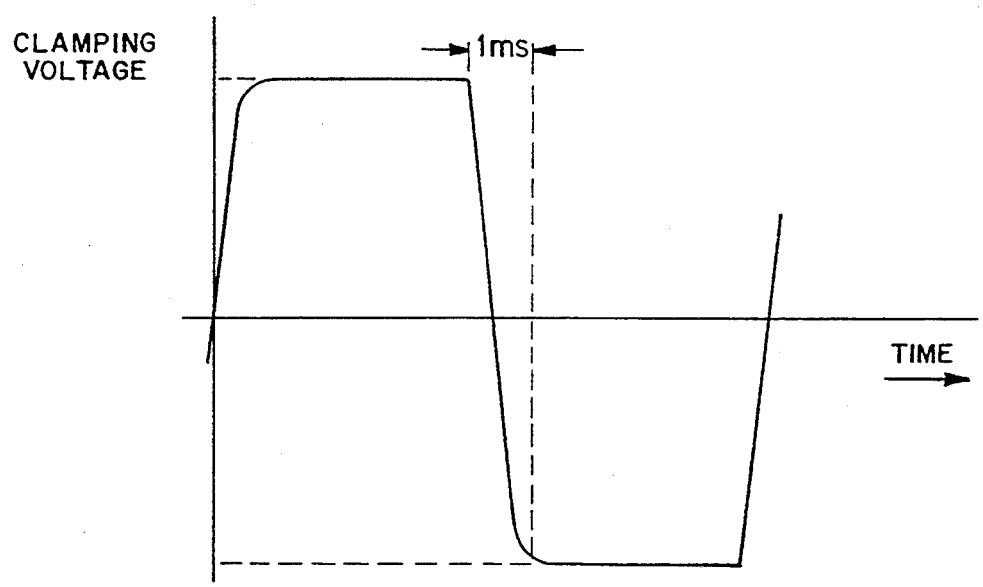
FIG. 5 is a graph which illustrates a preferred clamping voltage as a function of time.

It has been found that the performance of the electrostatic wafer clamp of the invention depends in part on the characteristics of the clamping voltage. A DC clamping voltage provides reliable clamping but results in polarization of the interface between the wafer 12 and clamping surface 18 so that the wafer remains clamped to the surface 18 after the clamping voltage has been turned off. A preferred clamping voltage is a bipolar square wave voltage having a peak-to-peak amplitude of at least 1000 volts and a frequency in the range of 30–300 Hz, as illustrated in FIG. 5 at 44. The bipolar square wave clamping voltage prevents charge buildup at the interface between wafer 12 and clamping surface 18.

In addition, it has been found desirable to limit the switching speed of the square wave clamping voltage to about 1000 volts per millisecond in order to prevent arcing between the wires 20, 22 and 24 and the wafer 12. The relatively slow switching time of the square wave clamping voltage reduces the current through the wafer-to-wire contact to values on the order of 1–10 milliamps. Techniques for generating clamping voltage waveforms of the type shown in FIG. 5 and described above are well known to those skilled in the art and will not be described in detail. It will be understood that the waveshape of the square wave clamping voltage depends on the circuit used for generating the clamping voltage. However, the switching speed of the square wave clamping voltage is preferably limited as described above. For example, a suitable clamping voltage can be obtained by clamping, or amplitude limiting, of a sine wave.

In an example of the first embodiment, a water-cooled aluminum platen was covered with an insulating layer of thermally-conductive silicone rubber having a thickness of 0.006 inch. The rubber layer was precision cast to ensure a flat surface with a smooth finish facing the wafer. The thickness of the rubber layer was carefully controlled to optimize thermal heat transfer between the wafer and the aluminum platen. A tungsten wire 0.001 inch in diameter was lightly stretched over the platen tangent to the rubber surface. The wire was processed by conventional cleaning techniques to obtain a bright, oxide-free surface to minimize electrical contact resistance to the wafer. This combination of materials and geometry required a clamping voltage in the 1000–2000 volt range to produce a clamping force in the range of 5–10 tort for use in both air and vacuum.

Figure 6:
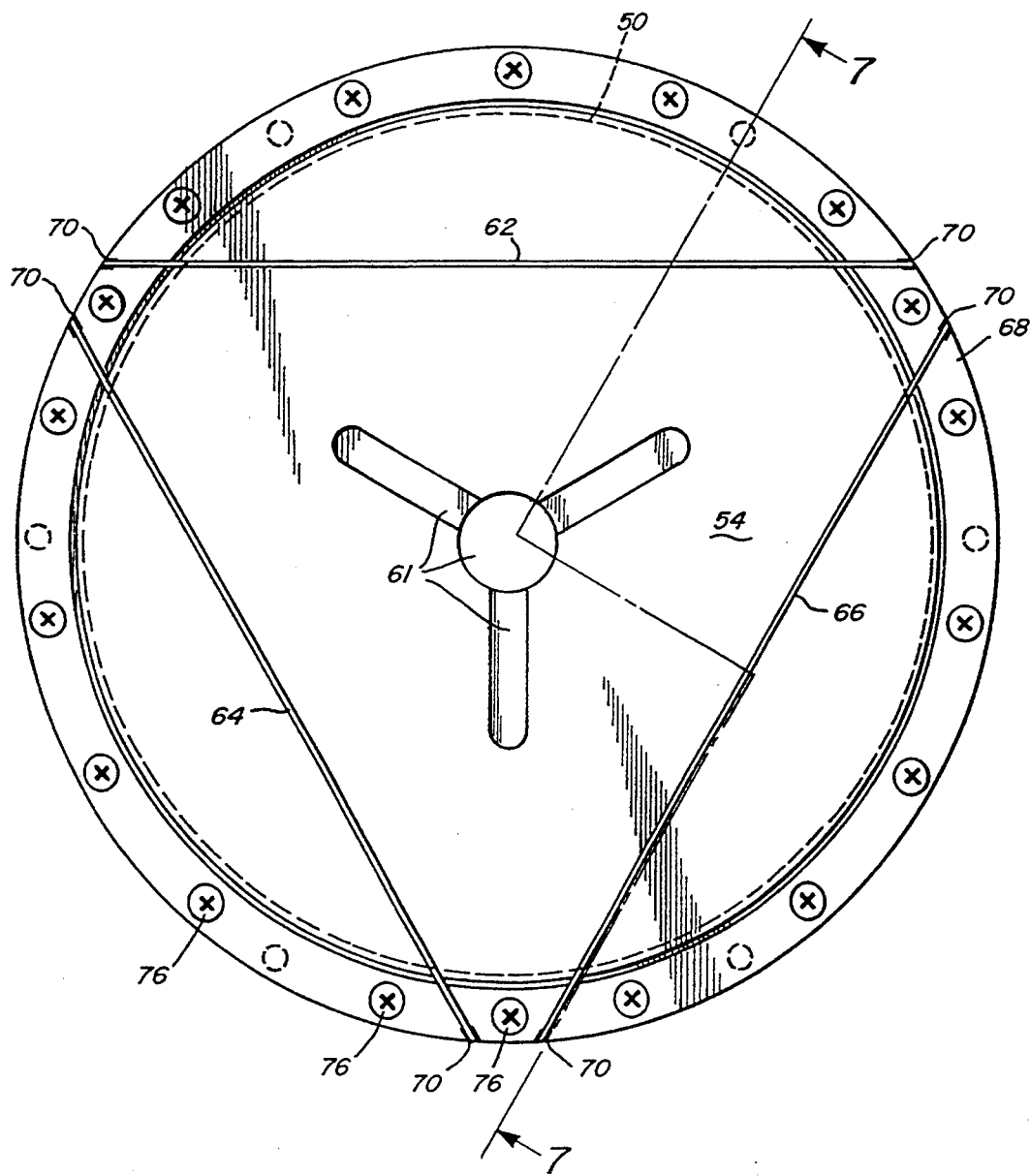
FIG. 6 is a plan view of an example of an electrostatic wafer clamping apparatus having contact wires positioned on the clamping surface.
Figure 7:
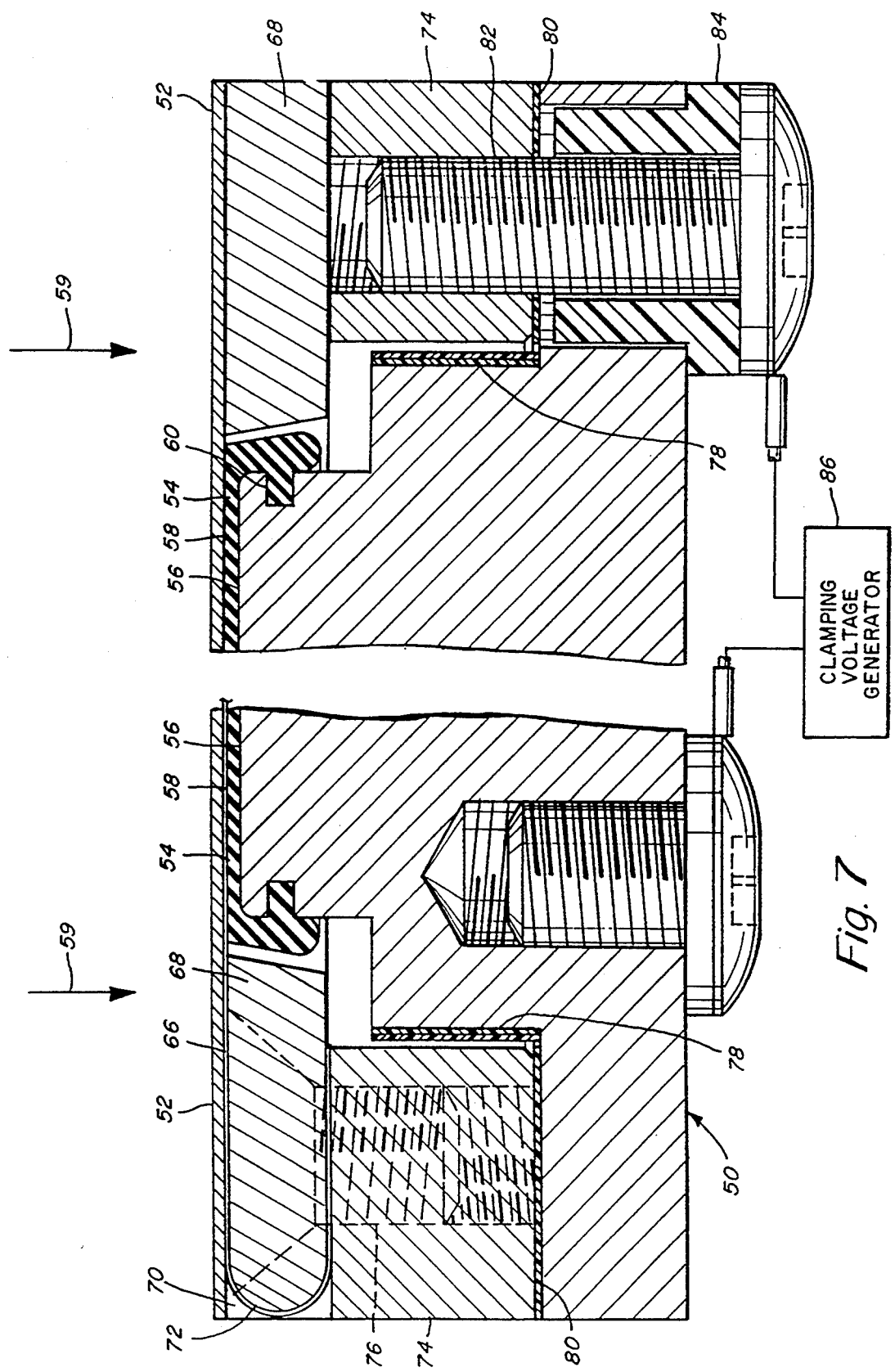
FIG. 7 is a partial cross-sectional view of the wafer clamping apparatus of FIG. 6.

An example of an electrostatic wafer clamping apparatus in accordance with the first embodiment of the invention is shown in FIGS. 6 and 7. An electrically conductive platen 50 provides mechanical support for a semiconductor wafer 52. A dielectric layer 54 is adhered to a flat surface 56 of platen 50. The dielectric layer 54 has a flat wafer clamping surface 58. The dielectric layer 54 can be a resilient, thermally-conductive silicone rubber as described hereinabove. The wafer 52 overlaps the outer edge of the dielectric layer 54 to prevent an incident ion beam 59 from damaging the dielectric layer 54 in the area of the wafer flat. The dielectric layer 54 is adhered to surface 56 and is molded into a groove 60 around the periphery of platen 50 to further insure that the dielectric layer 54 remains fixed to surface 56 during use. A central portion of platen 50 is provided with an opening 61 for a wafer lift mechanism (not shown).

Conductive wires 62, 64 and 66 are lightly stretched across clamping surface 58 and are attached to an annular support ring 68. Wires 62, 64 and 66 have the characteristics described above in connection with wires 20, 22 and 24. The ring 68 is provided with spaced-apart notches 70 for retaining wires 62, 64 and 66. Each notch 70 has a semicircular portion 72, as best shown in FIG. 7, to provide controlled bending of wires 62, 64 and 66. As shown in FIG. 7, wires 62, 64 and 66 are bent around the respective semicircular portions 72 and are retained between ring 68 and an annular ring 74 by machine screws 76. The rings 68 and 74 are electrically insulated from platen 50 by insulating spacers 78 and 80. The ring 74 is mechanically attached to platen 50 by suitable nonconducting machine screws or the like.

In operation, a clamping voltage as shown in FIG. 5 and described hereinabove is applied between wires 62, 64, 66 and platen 50 in order to securely clamp wafer 52 against dielectric layer 54.

Figure 8:
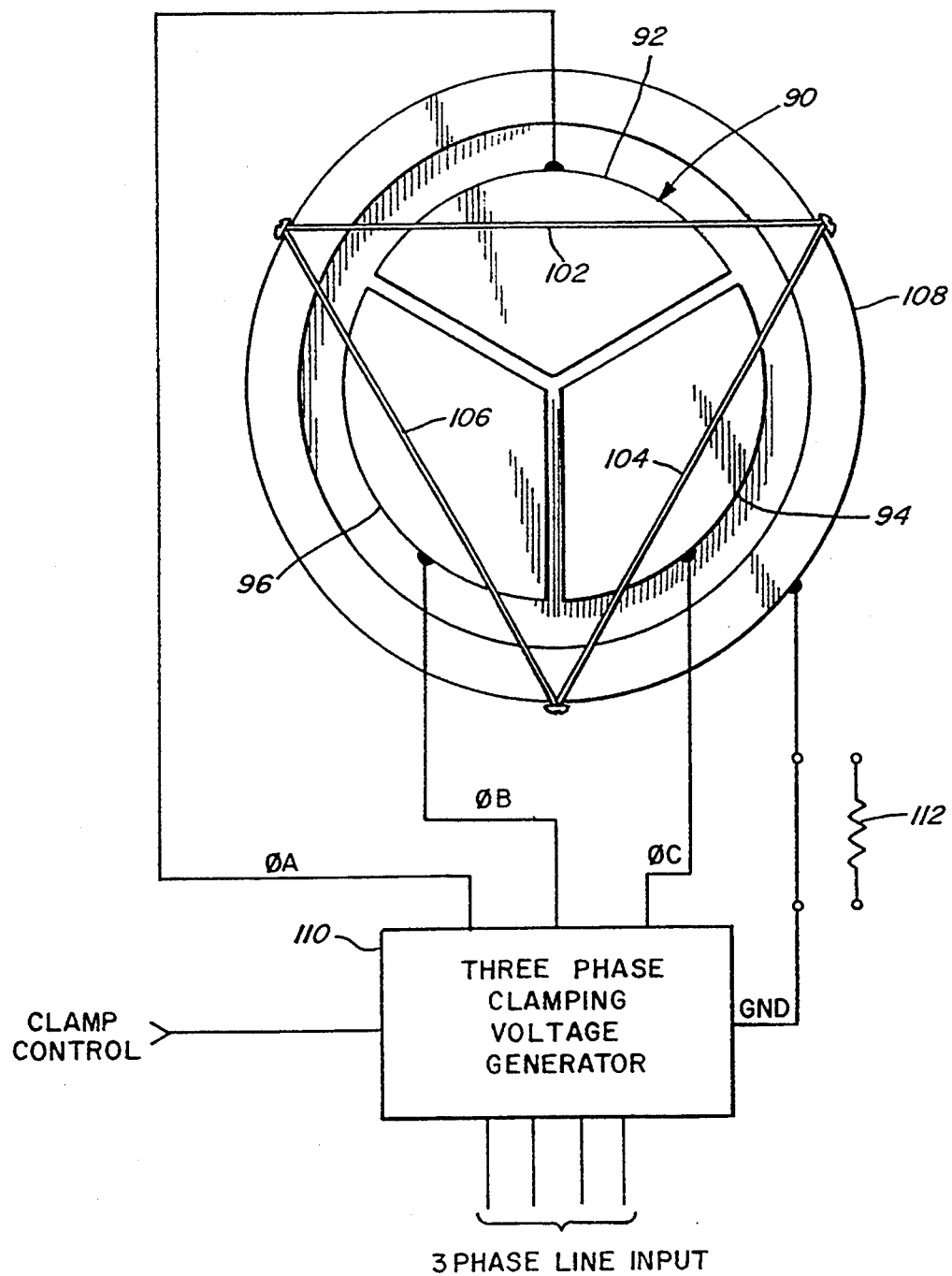
FIG. 8 is a schematic plan view of an electrostatic wafer clamping apparatus which utilizes a three-phase clamping voltage.

A second embodiment of the invention is shown in FIG. 8. A wafer clamping apparatus includes a conductive platen 90 which is radially divided into sections 92, 94 and 96. The sections 92, 94 and 96 are electrically isolated from each other. A dielectric layer having the same characteristics as dielectric layer 14 shown and described hereinabove is affixed to the surfaces of platen sections 92, 94 and 96. Wires 102, 104 and 106, having the same characteristics as wires 20, 22 and 24 shown and described hereinabove, extend across platen 90 and are electrically connected to a frame member 108. The frame member 108 is electrically isolated from platen 90. A three-phase clamping voltage generator 110 has a phase A ($\phi$A) output connected to platen section 92, a phase B ($\phi$B) output connected to platen section 96 and a phase C ($\phi$C) output connected to platen section 94. The ground line of the voltage generator 110 is connected to the frame member 108.

Figure 9:
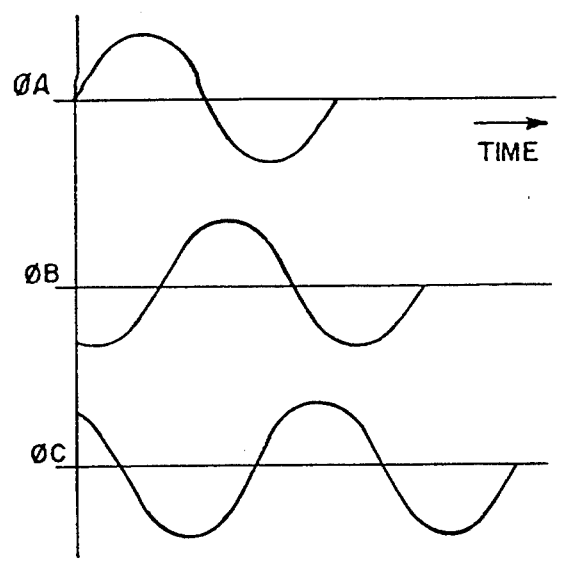
FIG. 9 is a graph which illustrates the phases of a three-phase sine wave clamping voltage suitable for use in the wafer clamping apparatus of FIG. 8.

According to one configuration of the three-phase wafer clamping apparatus, the outputs of the three-phase clamping voltage generator 110 are sine waves as shown in FIG. 9. The three phases are shifted relative to each other by 120° in conventional fashion.

The wafer clamping apparatus shown in FIG. 8 provides highly efficient thermal transfer when the dielectric layer is a thermally-conductive silicone rubber as described hereinabove in connection with dielectric layer 14 and in the aforementioned U.S. Pat. No. 4,832,781.

Figure 10:
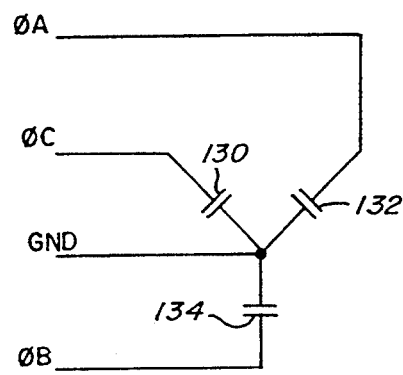
FIG. 10 is an equivalent circuit of the wafer clamping apparatus shown in FIG. 8.

An equivalent circuit of the three-phase wafer clamping apparatus is shown in FIG. 10. Platen sections 92, 94 and 96 and the wafer are equivalent to a Y-connected configuration of capacitors 130, 132 and 134 as shown in FIG. 10. As shown in FIG. 8, the wafer is connected to ground. The wafer corresponds to the plates of the capacitors 130, 132 and 134 which are connected to ground. Capacitor 130 represents capacitance between the wafer and platen section 94; capacitor 132 represents the capacitance between the wafer and platen section 92; and capacitor 134 represents the capacitance between the wafer and platen section 96. The wafer clamping apparatus appears to the three-phase voltage as a symmetrically-matched, Y-connected three-phase load. It is well known in the field of three-phase power distribution that when a three-phase, Y-configured distribution system is connected to a symmetrical, Y-configured load, the neutral current from the center of the load to the neutral of the system is zero. This principle is described by F. D. Hehre et al. in *Electrical Circuits*

*And Machinery*, Wiley & Sons (date) pp. 150–165. The fact that the current in the ground line is zero for such a configuration is important in the context of a wafer clamping apparatus. Since the ground current is zero, the connection to the wafer provided by wires 102, 104 and 106 can be removed without affecting clamping operation. Thus, the difficulties associated with making a low resistance electrical contact to a semiconductor wafer are eliminated.

A further advantage of the three-phase wafer clamping apparatus shown in FIG. 8 is that a constant clamping force is provided at all times. The holding force is proportional to the sum of the individual phase voltages squared. By contrast, in a single phase electrostatic wafer clamp, the clamping force goes to zero each time the clamping voltage crosses zero voltage. While this has not been found to be a problem in practice, the three-phase configuration eliminates potential loss in clamping force during zero crossings of the clamping voltage. Furthermore, the three-phase configuration can be used to provide a more fail-safe system. When the clamping voltage fails in a single phase system, an expensive semiconductor wafer can be damaged or destroyed. In the three-phase wafer clamping apparatus, some clamping force remains when one or two phases are lost. The three phases of the clamping voltage can be monitored. When one or two of the phases are lost, operation can be terminated without damage to the wafer.

As discussed above, the ground connection to the semiconductor wafer can be removed in the three-phase wafer clamping apparatus. In practice, however, it is usually preferable to provide a ground contact to the wafer in the form of wires 102, 104 and 106 or an equivalent low resistance connection. A zero value of ground current occurs only for perfectly balanced, three-phase sine wave voltages operating into perfectly matched loads. That is, each of the equivalent capacitors 130, 132 and 134 shown in FIG. 10 must be equal in value. In practice, there is usually a slight unbalance in the system. However, even when the system is somewhat unbalanced, the ground current is very small, and the chance of arcing to the wafer is minimal. A further advantage of utilizing the ground connection provided by wires 102, 104 and 106 is that the ground connection minimizes charge buildup due to the incident ion beam and provides a means for measuring the ion beam current incident on the semiconductor wafer. When it is desired to monitor ion beam current incident upon the wafer, a resistor 112 can be connected in series with the ground line as shown in FIG. 8.

When a three-phase sine wave clamping voltage is utilized in the wafer clamping apparatus of FIG. 8, the appropriate clamping voltages can be derived in voltage generator 110 directly from a three-phase line input. Step-up transformers can be utilized to provide the required clamping voltage amplitude, on the order of 1,000 volts peak-to-peak. Relays or other suitable analog switches can be utilized to turn the clamping voltage on and off.

Figure 11:
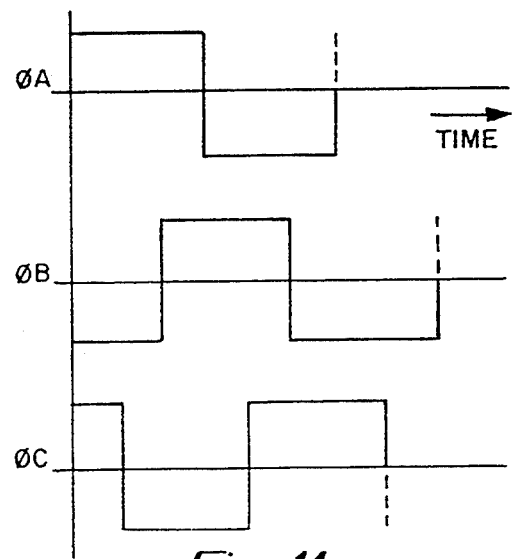
FIG. 11 is a graph which illustrates the phases of a three-phase square wave clamping voltage suitable for use in the wafer clamping apparatus of FIG. 8.

According to another aspect of the three-phase wafer clamping apparatus shown in FIG. 8, the three-phase clamping voltage can comprise square waves as shown in FIG. 11. The phase A, phase B, and phase C outputs of the clamping voltage generator 110 are square waves shifted relative to each other by one third of the square wave oscillation period. Preferably, the switching rate of the three-phase square wave clamping voltage is limited to about 1,000 volts per millisecond as shown in FIG. 5 and described hereinabove. The use of square waves as shown in FIG. 11 provides a greater clamping force than sine waves of same amplitude. Thus, an equivalent clamping force can be obtained with square waves of smaller amplitude in comparison with sine waves.

Since the ground current is zero only for a three-phase sine wave system, the ground current is nonzero when a three-phase square wave clamping voltage is utilized. However, the magnitude of the ground current is generally much smaller than in the case of a single phase system, thereby reducing the risk of arcing. Furthermore, when either a sine wave or a square wave three-phase clamping voltage is utilized, the wafer can be reliably clamped even when the contact resistance between the ground wires 102, 104 and 106 and the semiconductor wafer is high.

The three-phase wafer clamping apparatus of FIG. 8 has been shown and described with wires 102, 104 and 106 for making electrical contact to the wafer. It will be understood that any suitable technique can be utilized for making electrical contact to the wafer in the three-phase configuration and that such three-phase wafer clamping configurations are included within the scope of the invention.

The embodiment of FIG. 8 has been described in connection with a three-phase system wafer clamping apparatus. A three-phase system is the preferred configuration of a polyphase clamping system since three-phase line voltages are frequently available. However, a two-phase clamping system provides acceptable performance, particularly for relatively low clamping voltages. Furthermore, electrostatic wafer clamps utilizing a clamping voltage with more than three phases are included within the scope of the present invention.

The silicone rubber dielectric layer performs several important functions in the electrostatic wafer clamping apparatus shown in FIGS. 1–3 and 6–8. The silicone rubber layer electrically insulates the wires 20, 22, 24 and wafer 12 from the platen 10 potential. A silicone rubber layer having a thickness of 0.006 inch has been tested in vacuum with 2000 volts across the rubber layer without failure. The silicone rubber layer also provides a distributed compressive force against the wires 20, 22 and 24 to establish a long, thin line contact with the back surface of wafer 12 that ensures electrical contact.

The silicone rubber layer exhibits wafer cooling capability of several watts per square centimeter when compressed by the electrostatic clamping force in accordance with the invention. It will be understood, however, that the dielectric layer used in the electrostatic wafer clamping assemblies which are shown and described herein is not necessarily thermally-conductive. When cooling of the wafer is not required, the dielectric layer can be a thermal insulator without affecting the clamping operation of the assembly.

Finally, the silicone rubber layer exhibits elastic flow and compressive properties that permit the wires 20, 22, 24 to be pressed into the space occupied by the rubber layer without distorting the wafer 12 or interrupting the contact between the clamping surface 18 and the wafer 12, except in a region approximately equal in width to the diameter of the wires.

The embodiments of FIGS. 1–3 and 6–8 provide apparatus for establishing a simple back surface, low-resistance contact to a wafer. The use of one or more wires establishes a large surface area electrical contact over an area proportional to the wafer size, thus minimizing current concentration in the bulk of the wafer and at contact points. The contact is distributed over the rear of the wafer, thereby ensuring short conduction paths through the body of large wafers. The clamping technique is completely free of clamping rings or other devices which obstruct the front surface of the wafer, thus permitting very shallow angle implants. The clamping apparatus holds a wafer securely against a flat cooling platen during high power implant processing, thus making possible uniform implant angle processing across the wafer surface. The configuration which utilizes one or more fine wires positioned between the wafer and the clamping surface of the thermally-conductive, electrically-insulating, soft, pliable silicone rubber platen produces a negligible change in the cooling performance relative to a platen that does not utilize wires. Each wire compresses the soft rubber with minimal distortion of the wafer so that the wafer remains flat. The restoring force from the compressed rubber tends to press the fine wire against the wafer surface, thereby causing optimum conformance of the wire to the more rigid wafer surface. The electrical contact between the wire and the wafer is thereby enhanced.

The thermally-conductive silicone rubber exhibits efficient heat transfer and superior electrical insulation and dielectric properties for electrostatic clamping. The pliable, nearly plastic flow of the silicone rubber ensures that the rubber flows into and conforms to the surface contours of the silicon wafer, thus ensuring intimate contact between the wafer and the rubber. The dielectric permittivity and dielectric strength of the silicone rubber are more than adequate to achieve the required physical holding force for wafer handling and cooling. The additives used to increase the thermal conductivity of the silicone rubber also raise the permittivity of the rubber, thus, increasing the holding force for a given applied voltage.

A third embodiment of the invention is shown in FIGS. 12, 13, 14A and 14B. An electrostatic wafer clamping apparatus includes a platen 200 and a clamping control circuit 202 for applying clamping voltages to the platen 200 when clamping of a workpiece is desired. The platen 200 includes a support plate, or platen base 204, and an insulating substrate 206 mounted on an upper surface of platen base 204. The platen base 204 and the insulating substrate 206 are generally circular and may have a central opening 208 for a wafer lift mechanism (not shown).

Figure 12:
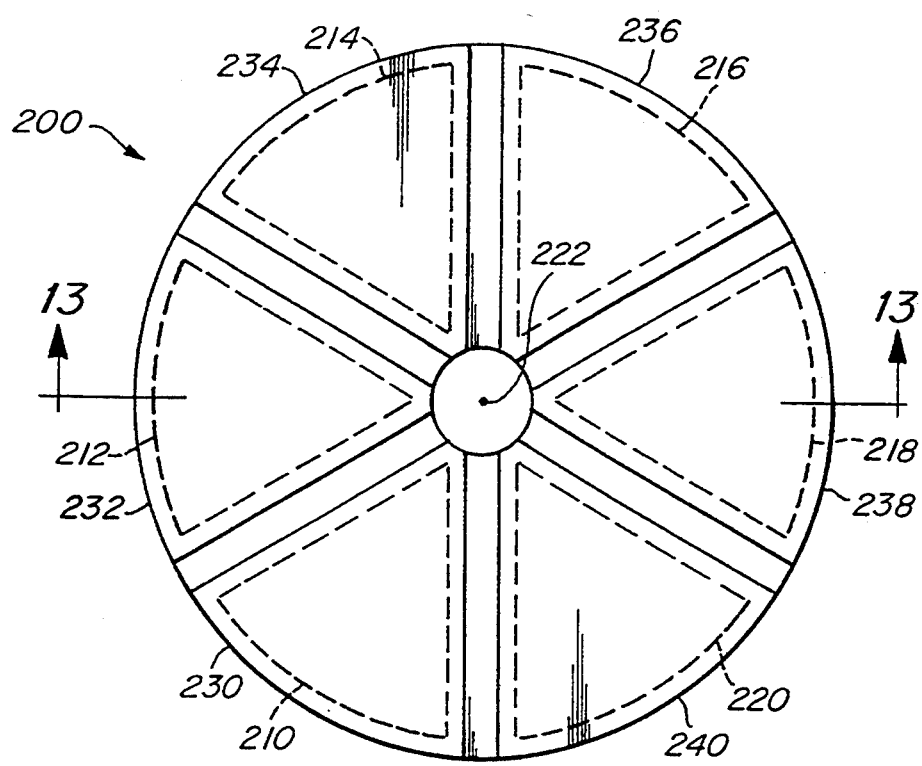
FIG. 12 is a schematic plan view of an electrostatic wafer clamping apparatus which has a platen with six electrodes and which utilizes a six phase clamping voltage.

Six equally-spaced electrodes 210, 212, 214, 216, 218 and 220 are located between an upper surface of insulating substrate 206 and sector dielectric insulators 230, 232, 234, 236, 238 and 240, respectively. The electrodes are preferably thin metal layers formed on the lower surfaces of the respective sector dielectric insulators. The electrodes 210, 212, 214, 216, 218 and 220 preferably have equal areas and are symmetrically disposed with respect to a center 222 of the platen 200. The electrodes are electrically isolated from each other and, in a preferred embodiment, are sector shaped as shown in FIG. 12. The upper surfaces of dielectric insulators 230, 232, 234, 236, 238 and 240 are coplanar and define a wafer clamping surface 242. Preferably, the dielectric insulators overlap the edges of the respective electrodes to prevent contact between the electrodes and the wafer.

Figure 13:
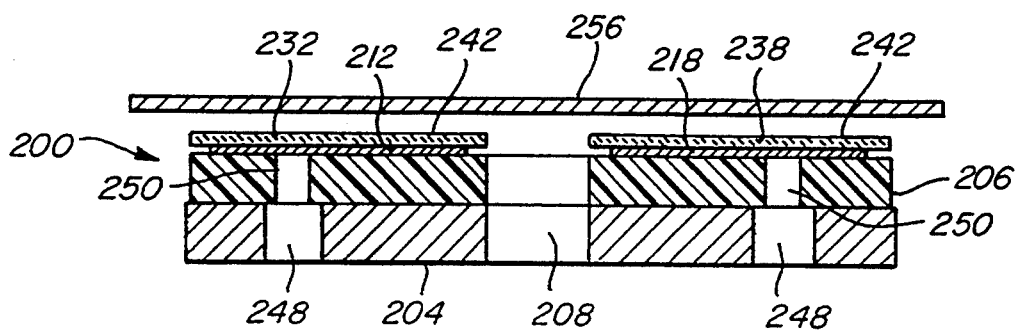
FIG. 13 is a cross-sectional view, taken along the line 13—13 of FIG. 12, of the wafer clamping apparatus of FIG. 12.

The platen base 204 and the insulating substrate 206 are provided with aligned openings 248 and 250, respectively, underlying each of the electrodes. The openings 248 and 250 permit electrical connection to each of the electrodes. A semiconductor wafer 256 is shown in FIG. 13 positioned above clamping surface 242. When clamping voltages are applied to electrodes 210, 212, 214, 216, 218 and 220 as described in detail below, the wafer 256 is electrostatically clamped in a fixed position against clamping surface 242.

The dielectric insulators 230, 232, 234, 236, 238 and 240 are preferably a hard ceramic material that has high dielectric strength and high permittivity and does not exhibit bulk polarization at the frequency and voltage used for clamping. Preferred materials include alumina, sapphire and aluminum nitride. In a preferred embodiment, the dielectric insulators are fabricated of alumina having a thickness of about 0.2 mm. This thickness permits reliable clamping with a voltage having a peak amplitude of about 1000 volts. The upper surfaces of the dielectric insulators, which define the clamping surface 242, are ground flat to within 0.001 inch. The flat clamping surface can be obtained using conventional grinding, polishing and lapping techniques. The alumina dielectric insulators provide a hard wafer clamping surface that has long term durability, is extremely clean and does not cause wafer sticking.

The electrodes 210, 212, 214, 216, 218 and 220 are preferably formed by evaporation of metal layers on the lower surfaces of the respective dielectric insulators. In particular, the electrodes preferably comprise a very thin titanium layer applied directly to the alumina dielectric insulator as a wetting agent and a molybdenum layer over the titanium for high conductivity. The molybdenum is selected because it has a thermal expansion coefficient that is closely matched to the thermal expansion coefficient of alumina. The total thickness of each electrode is typically on the order of about one micrometer. It is important that the electrode be formed on the lower surface of the dielectric insulator so as to avoid any air gap between the electrode and the insulator. Even a slight air gap between the electrode and the insulator or between the wafer and the insulator can cause a significant reduction in clamping force. A thicker dielectric insulator requires a larger clamping voltage, which could potentially damage devices on the wafer. A thinner dielectric insulator may lack structural stability and durability.

In the preferred embodiment, a separate dielectric insulator is fabricated for each electrode, with electrode having a smaller area than the dielectric insulator. In another embodiment, the dielectric insulator can be formed as a circular disk having a central opening, if necessary, with multiple electrodes formed on its lower surface by evaporation. This configuration may be practical for relatively small platens having diameters of 100 mm or less. For larger diameter platens, separate dielectric insulators are more easily fabricated.

The insulating substrate 206 has sufficient thickness to support the platen structure and to electrically isolate the electrodes. The insulating substrate is preferably fabricated of the same material as the dielectric insulators for matching of thermal expansion coefficients. In the preferred embodiment, the substrate 206 is fabricated of alumina. The platen base 204 is typically fabricated of a metal such as aluminum.

The dielectric insulators having electrodes formed on their lower surfaces are bonded to the upper surface of the insulating substrate 206. Preferably, a thermoplastic tetrafluoroethylene fastener, such as Teflon FEP film available from DuPont Company, is used as an adhesive. The thermoplastic fastener is placed between the dielectric insulators and the insulating substrate 206, and the assembly is heated to approximately 300° C. in vacuum. The tetrafluoroethylene fastener melts and forms a secure bond between the dielectric insulators and the insulating substrate 206. The tetrafluoroethylene bonding technique is very clean and does not cause outgassing during vacuum processing.

The clamping voltages applied to the electrodes of platen 200 are preferably bipolar square waves having six different phases (0°, 60°, 120°, 180°, 240° and 300°). The phases of the voltages applied to electrodes on opposite sides of the platen 200 are one-half cycle, or 180°, out of phase. Thus, the voltages applied to electrodes 212 and 218 are one-half cycle out of phase; the voltages applied to electrodes 210 and 216 are one-half cycle out of phase; and the voltages applied to electrodes 214 and 220 are one-half cycle out of phase. As described below, the disclosed clamping apparatus provides reliable clamping and unclamping of wafers without requiring contact to the wafer and without producing charging currents which could potentially damage the wafer.

The six phase square wave voltages preferably have an amplitude in a range of about 900 to 1200 volts peak, with a preferred voltage of about 1000 volts peak. This voltage range provides sufficient clamping force to overcome any curvature of the wafer and cause it to conform to the clamping surface 242. Voltages higher than this range may cause damage to devices on the wafer. The frequency of the square wave voltages is in a range of about 1 Hz to 300 Hz and is preferably in a range of about 20 to 50 Hz, with a most preferred operating frequency of about 30 Hz. Lower frequencies produce surface charging, which can cause wafer sticking. Higher frequencies provide reduced holding force for a given charging current. For a clamping voltage having a frequency of 30 Hz, the switching time of the square wave is preferably limited to about 3 milliseconds. This relatively low switching speed limits the rate at which the electrodes charge and thereby limits voltage transients which could potentially damage the wafer.

Figure 14A:
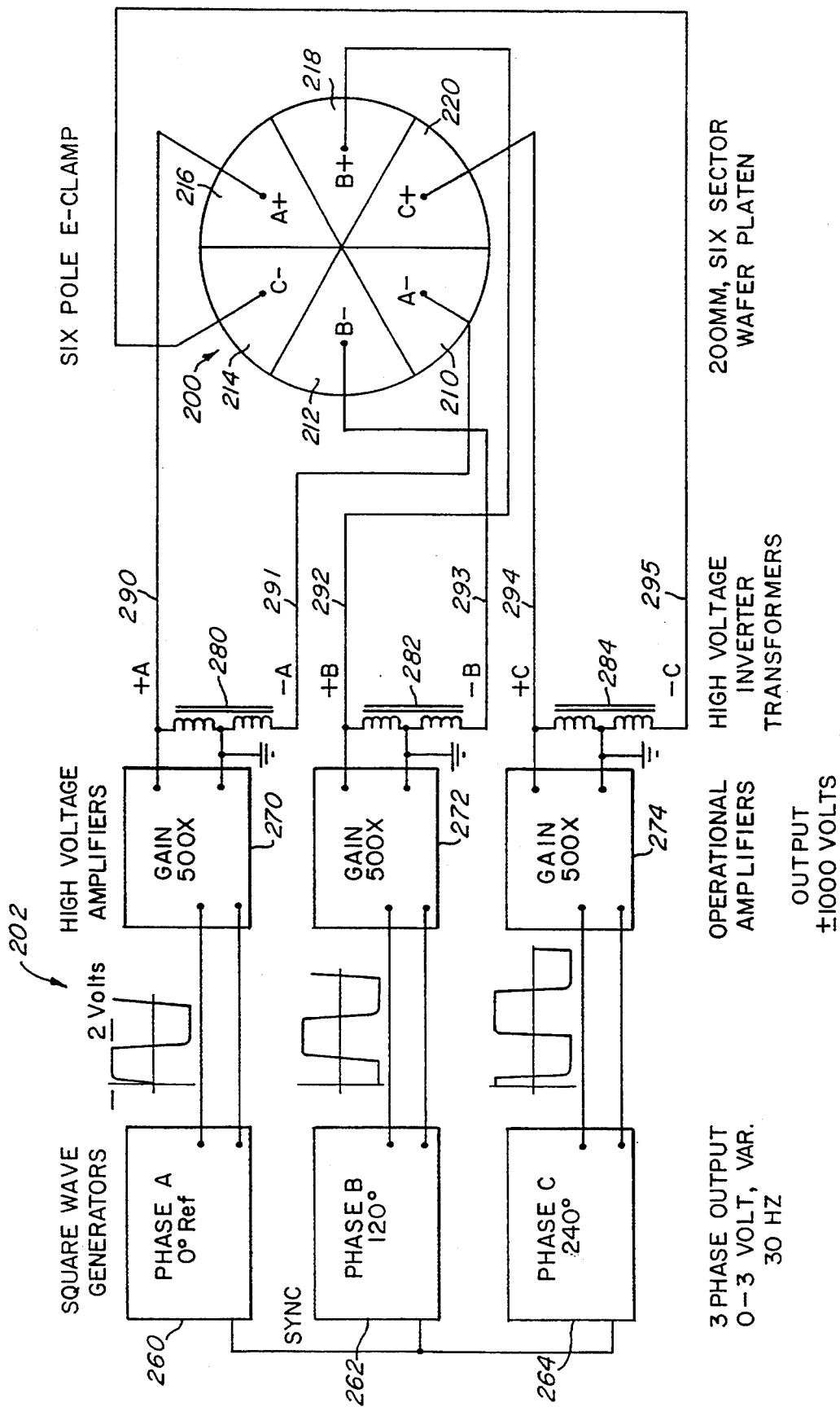
FIG. 14A is a schematic block diagram of an example of a clamping control circuit for generating voltages for operation of the wafer clamping apparatus of FIG. 12.

A schematic block diagram of clamping control circuit 202 for applying clamping voltages to platen 200 is shown in FIG. 14A. It will be understood that the clamping control circuit 202 is only one example of a suitable circuit for generating the clamping control voltages. Any circuit capable of generating square wave voltages of the required amplitude, frequency and phases can be utilized.

The clamping control circuit 202 includes square wave generators 260, 262 and 264 which generate low voltage square waves of equal amplitude and frequency. The frequency is preferably about 30 Hz. The phases of the output square waves differ by 120°. Thus, square wave generator 260 produces a square wave at a reference phase of 0°; square wave generator 262 produces a square wave at a phase of 120°; and square wave generator 264 produces a square wave at a phase of 240°. The outputs of square wave generators 260, 262 and 264 are input to high voltage amplifiers 270, 272 and 274, respectively. The amplifiers 270, 272 and 274 increase the amplitude of the respective square waves to approximately 1000 volts peak.

The outputs of amplifiers 270, 272 and 274 are applied to high voltage inverter transformers 280, 282 and 284, respectively. The transformers 280, 282 and 284 have grounded center taps and produce two output voltages that are 180°, or one-half cycle, out of phase. Thus, the outputs of transformer 280 on line 290 (+A) and line 291 (−A) are bipolar square waves that are one-half cycle out of phase. Similarly, the outputs of transformer 282 on line 292 (+B) and line 293 (−B) are bipolar square waves that are one-half cycle out of phase and are shifted by 120° relative to the outputs of transformer 280. The outputs of transformer 284 on line 294 (+C) and line 295 (−C) are one-half cycle out of phase and are shifted by 240° relative to the outputs of transformer 280. The voltage waveforms +A, −A, +B, −B, +C and −C are shown in FIG. 14B. The outputs of transformer 280 on lines 290 and 291 are coupled to electrodes 216 and 210, respectively. The outputs of transformer 282 on lines 292 and 293 are coupled to electrodes 218 and 212, respectively. The outputs of transformer 284 on lines 294 and 295 are coupled to electrodes 220 and 214, respectively. In a variation of the wafer clamping apparatus, the connections to electrodes 218 and 212 are reversed. In this configuration, line 292 is connected to electrode 212, and line 293 is connected to electrode 218.

Figure 15:
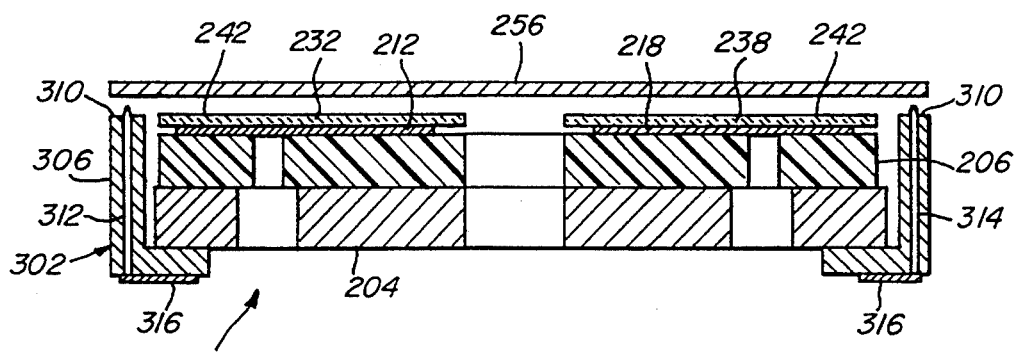
FIG. 15 is a cross-sectional view of an electrostatic wafer clamping apparatus which has a platen with six electrodes and a peripheral grounding ring for grounding of the workpiece.

In some cases, it may be desirable to ground the wafer in order to eliminate charge buildup caused by the ion beam, to compensate for any imbalance in the wafer clamping apparatus and to compensate for wafer imperfections. A wafer clamping apparatus incorporating wafer grounding is shown in FIG. 15. Like elements in FIGS. 13 and 15 have the same reference numerals. A platen 300 includes platen base 204, insulating substrate 206, electrodes 210 to 220 and sector dielectric insulators 230 to 240 as described above. A conductive grounding ring 302 surrounds the periphery of platen base 204 and insulating substrate 206. The grounding ring 302 is attached to platen base 204 and includes an annular wall 306 having a top surface 310 that is coplanar with clamping surface 242. When the wafer 256 is clamped to surface 242, the outer periphery of the wafer contacts clamping ring 302, thereby grounding the wafer 256. To insure reliable contact with wafer 256, spring loaded grounding pins 312, 314, etc. are preferably provided. The pins 312 and 314 are normally biased slightly above surface 310 by springs 316. When the wafer 256 is clamped against surface 242 by electrostatic forces, the pins 312, 314, etc. are depressed downwardly, and the springs urge the pins into contact with the wafer, thereby ensuring reliable contact with wafer 256. Preferably, three or more grounding pins are utilized in grounding ring 302.

The third embodiment of the electrostatic clamping apparatus shown in FIGS. 12, 13, 14A, 14B and 15, in effect, operates as a six phase clamp. By providing opposite phases to electrodes on opposite sides of the platen 200, electrical contact with the wafer is not required for clamping. By utilizing bipolar square wave clamping voltages as described, a clamping voltage is applied to the wafer at all times and vibration is eliminated. Even when two of the clamping voltages are passing through zero volts, four other clamping voltages are at full amplitude.

Figure 16A:
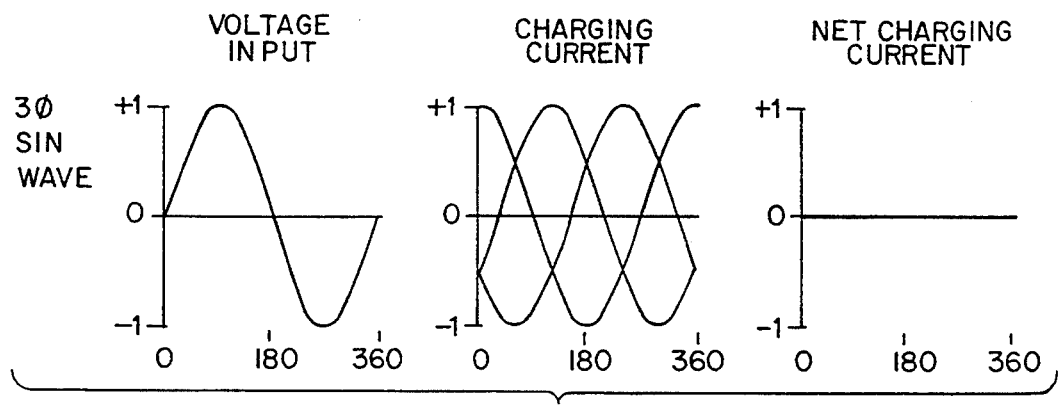
FIGS. 16A to 16C illustrate charging currents for a three phase sine wave clamping voltage, a three phase square wave clamping voltage and a six phase square wave clamping voltage, respectively.
Figure 16B:
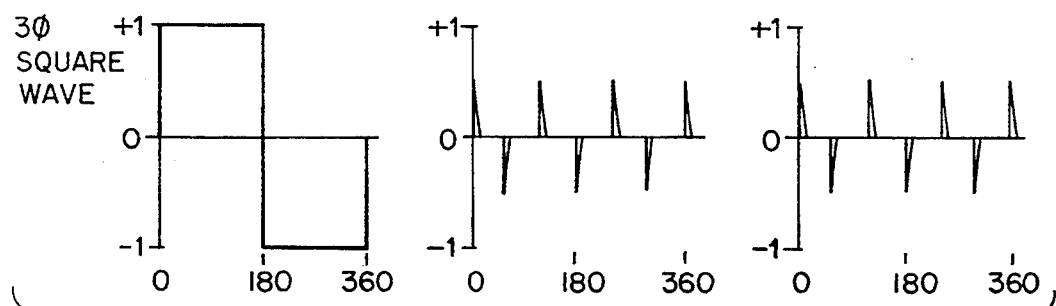
Figure 16C:
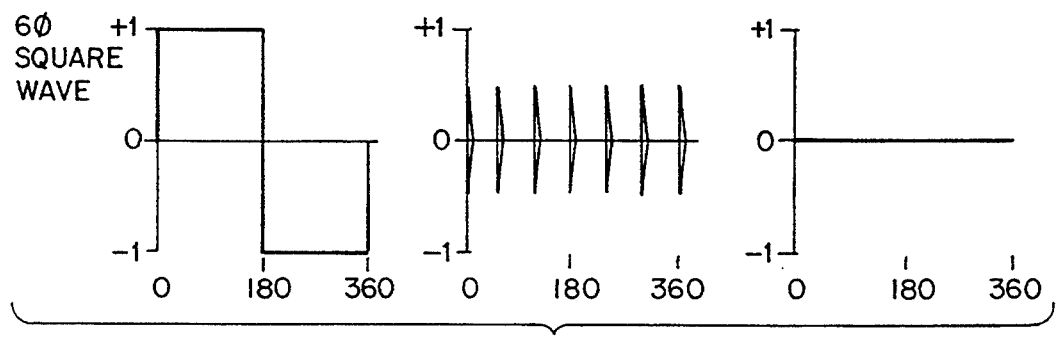

A further advantage of the third embodiment of the invention is illustrated to reference to FIGS. 16A to 16C. In an electrostatic wafer clamp employing three sectors and a three phase sine wave clamping voltage, there is perfect cancellation of the AC capacitive charging currents flowing from each sector to the wafer. The total charging current is given by the sum of three sinusoidal currents, each 120° out of phase, and this sum is identically equal to zero as illustrated in FIG. 16A. This cancellation means that not only is electrical contact to the wafer not required in order to provide the holding force, but that the electrical potential of the wafer will remain zero at all times while it is held on the platen, even though there is no electrical contact to the wafer.

However, the use of a sinusoidal clamping voltage is not optimal in a wafer clamping apparatus. Square wave voltages are preferred for two reasons. First, for a given peak voltage, the mean holding force is larger for a square wave clamping voltage than for a sine wave clamping voltage. Second, with square wave clamping voltages, there is a reduction in the period of time for which the holding force on any given sector is zero or close to zero. Consequently, vibration of the wafer is greatly reduced compared to the use of sine waves.

Unfortunately, when square wave voltages are used in a three phase clamping apparatus as shown in FIG. 8, than the advantage of charging current cancellation is lost. Charge passes to the wafer in a series of current spikes and, unless the wafer is grounded by an effective electrical contact, the electrical potential of the wafer will change at a frequency that is three times the three phase square wave frequency, as illustrated in FIG. 16B. Such voltage excursions of the wafer surface, which may amount to many hundreds of volts in a practical device, can cause damage to sensitive devices being processed on the wafer, or may interfere with the process being carried out, such ion implantation or plasma etching.

The charging currents for the six sector wafer clamping apparatus of FIGS. 12 and 13 are shown in FIG. 16C. In this case, the current spike from each sector is cancelled by a simultaneous spike of opposite polarity from the opposing sector on the platen. The net charging current therefore cancels to zero. Furthermore, for the six sector wafer clamping apparatus, the charging current cancels for any arbitrary input waveform.

As noted above, the dielectric insulators 230, 232, 234, 236, 238 and 240 in the wafer clamping apparatus of FIGS. 12 and 13 are preferably a hard ceramic material. Furthermore, the dielectric insulators and the wafer have nominally flat surfaces. This results in physical contact between the wafer and the dielectric insulators over a relatively small percentage of their surface areas. As a result, thermal transfer from the wafer 256 to the dielectric insulators is relatively poor when the clamping apparatus is operated in vacuum. Thermal transfer by conduction occurs only over those areas of the wafer 256 that are in physical contact with the dielectric insulators.

Figure 17:
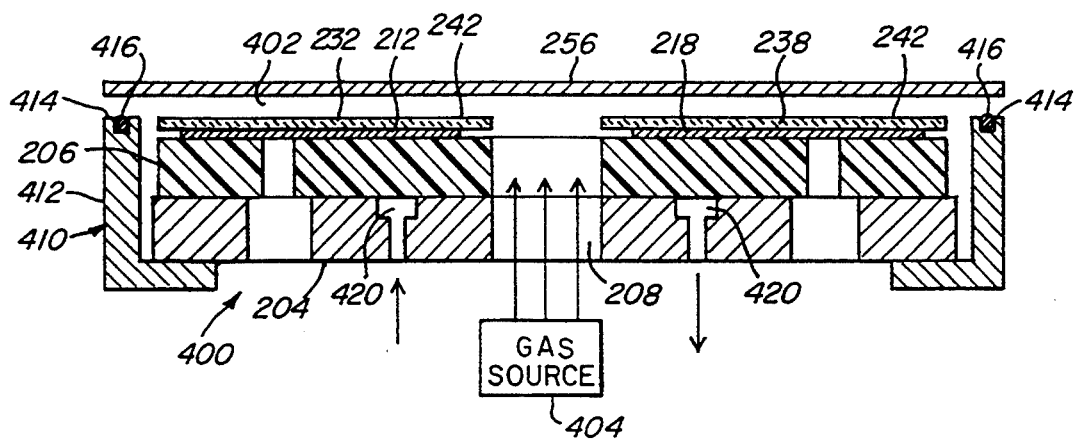
FIG. 17 is a cross-sectional view of an electrostatic wafer clamping apparatus similar to the clamping apparatus shown in FIGS. 12 and 13 and including wafer cooling.

Since wafer cooling is frequently a requirement in ion implantation systems, a variation of the third embodiment of the invention including wafer cooling is shown in FIG. 17. Like elements in FIGS. 13 and 17 have the same reference numerals. A platen 400 includes platen base 204, insulating substrate 206, six electrodes 210–220 and six sector dielectric insulators 230–240, as described above in connection with FIG. 13.

In addition, the platen shown in FIG. 17 includes means for introducing a gas into a region 402 between wafer 256 and clamping surface 242. Although the wafer 256 is shown in FIG. 17 raised above clamping surface 242, it will be understood that even when the wafer 256 is firmly clamped to clamping surface 242, voids will exist between the wafer and the clamping surface due to wafer irregularities and warping, and microscopic variations in the surfaces. A gas is coupled from a gas source 404, shown schematically in FIG. 17, through a suitable conduit (not shown) and through central opening 208 to the region 402 between wafer 256 and clamping surface 242.

The platen 400 further includes an annular sealing ring 410 surrounding the periphery of platen base 204 and insulating substrate 206. The annular sealing ring 410 includes an annular wall 412 having a top surface 414 that is coplanar with clamping surface 242. An elastomer sealing ring 416 is mounted in a groove in top surface 414. When the wafer 256 is clamped to surface 242, the elastomer ring 416 is partially compressed and seals the region 402 at its outer periphery. The peripheral seal prevents the gas introduced from source 404 from escaping into the vacuum chamber.

The gas is typically nitrogen or other thermally-conductive gas at a pressure of about 1.0 to 40 torr. The pressure of the gas is selected to maximize thermal conduction without lifting the wafer 256 from clamping surface 242. The gas in region 402 between wafer 256 and clamping surface 242 promotes conduction of thermal energy between wafer 256 and clamping surface 242 and limits heating of the wafer. Techniques for gas conduction cooling are well known to those skilled in the art.

According to a further feature of the invention, the platen 400 includes cooling means for removing thermal energy transferred from the wafer to the platen. In the embodiment of FIG. 17, the platen base 204 is provided with an annular passage 420 for circulation of a cooling liquid such as water. The passage 420 includes an inlet and an outlet for connection to a liquid cooling and circulation system (not shown). It will be understood by those skilled in the art that a variety of configurations can be provided for circulation of the cooling liquid. The liquid cooling system is sealed from the remainder of the platen assembly.

When an ion beam is incident on wafer 256, heat is generated in the wafer. The heat is transferred from wafer 256 through dielectric insulators 230–240 and insulating substrate 206 to platen base 204. The thermal energy is removed from platen base 204 by the liquid cooling system. The transfer of thermal energy from wafer 256 to the platen occurs by solid-to-solid thermal conduction in the areas of physical contact between wafer 256 and clamping surface 242 and by gas conduction in the areas where the wafer 256 does not physically contact clamping surface 242.

While there have been shown and described what are at present considered the preferred embodiments of the present invention, it will be obvious to those skilled in the art that various changes and modifications may be made therein without departing from the scope of the invention as defined by the appended claims.

What is claimed is:

1. Apparatus for electrostatic clamping of a workpiece, comprising:

a platen having a substantially circular, electrically insulating clamping surface for receiving a workpiece and at least six platen sectors each having a conductive electrode underlying and electrically isolated from said clamping surface said electrodes being configured in pairs symmetrically disposed about a center of said clamping surface, said clamping surface comprising a dielectric material selected to avoid sticking of the workpiece thereto after clamping; and clamping control means for applying AC voltages to said electrodes when clamping of the workpiece is desired, the workpiece being electrostatically clamped in a fixed position on said clamping surface when said AC voltages are applied to said electrodes, said clamping control means comprising means for generating at least six bipolar square wave voltages having relative phases of 0°, 60°, 120°, 180°, 240° and 300°, said square wave voltages defining a first set having phases 0° and 180°, a second set having phases 60° and 240°, and a third set having phases 120° and 300° each of said sets including positive and negative, equal amplitude, bipolar square wave voltages that are one half cycle out of phase, each of said bipolar square wave voltages having a predetermined switching speed selected to limit transients which could potentially damage the workpiece, and means for coupling said sets of square wave voltages to said Symmetrically disposed electrode pairs so as to provide symmetrical clamping of said workpiece to said clamping surface providing reliable high speed clamping with reduced risk of damage to said workpiece.

2. Apparatus as defined in claim 1 wherein said electrodes comprise metal layers underlying said dielectric material.

3. Apparatus as defined in claim 1 wherein said electrodes have equal areas.

4. Apparatus as defined in claim 2 wherein said clamping surface is flat.

5. Apparatus as defined in claim 2 wherein said dielectric material does not exhibit bulk polarization at the frequency and voltage used for clamping of the workpiece.

6. Apparatus as defined in claim 2 wherein said dielectric material is selected from the group consisting of alumina, sapphire and aluminum nitride.

7. Apparatus as defined in claim 2 wherein said dielectric material comprises alumina.

8. Apparatus as defined in claim 2 wherein said dielectric material is thermally conductive.

9. Apparatus as defined in claim 2 wherein said platen further includes an insulating substrate for supporting each of said electrodes and said dielectric material, and a support plate for said insulating substrate.

10. Apparatus as defined in claim 9 wherein said support plate includes a passage for circulation of a cooling fluid.

11. Apparatus as defined in claim 9 wherein said platen further includes a peripheral grounding ring for contacting said workpiece.

12. Apparatus as defined in claim 1 wherein said dielectric material comprises six dielectric insulators, one for each of said electrodes, and said electrodes each comprise a metal layer formed on a lower surface of respective ones of said dielectric insulators.

13. Apparatus as defined in claim 12 wherein said dielectric insulators comprise alumina and said electrodes comprise a molybdenum layer and a thin titanium layer between said molybdenum layer and said dielectric insulator.

14. Apparatus as defined in claim 13 wherein said electrodes are evaporated on the lower surfaces of said dielectric insulators.

15. Apparatus as defined in claim 12 wherein said platen further comprises an insulating substrate for support of said dielectric insulators and said electrodes, and wherein said dielectric insulators, having electrodes formed on lower surfaces thereof, are bonded to said insulating substrate by tetrafluoroethylene fasteners.

16. Apparatus as defined in claim 1 wherein each of said square wave voltages has a fundamental frequency in a range of about 1 Hz to 300 Hz.

17. Apparatus as defined in claim 1 wherein said workpiece comprises a semiconductor wafer.

18. Apparatus as defined in claim 1 wherein each of said square wave voltages has a fundamental frequency in a range of about 20 Hz to 50 Hz.

19. Apparatus as defined in claim 1 wherein each of said square wave voltages has a fundamental frequency of about 30 Hz.

20. Apparatus as defined in claim 19 wherein said switching speed is about 3 milliseconds.

21. Apparatus as defined in claim 19 wherein each of said bipolar square wave voltages has a peak amplitude in a range of about 900 volts to 1200 volts.

22. Apparatus as defined in claim 1 further including means for introducing a gas into a region between said workpiece and said clamping surface for conducting thermal energy between said workpiece and said clamping surface when said apparatus is utilized in a vacuum environment.

23. Apparatus as defined in claim 22 further including means for sealing the region between said workpiece and said clamping surface near an outer periphery thereof to prevent escape of said gas from said region.

24. Apparatus as defined in claim 1 further including means for cooling said platen.

25. Apparatus as defined in claim 1 wherein said electrodes comprise sector-shaped electrodes having equal areas, wherein said dielectric material is selected from the group consisting of alumina, sapphire and aluminum nitride, and wherein each of said square wave voltages has a fundamental frequency in a range of about 20 Hz to 50 Hz.

26. Apparatus for electrostatic clamping of a workpiece, comprising:

a platen having an electrically insulating clamping surface for receiving a workpiece and 2n conductive electrodes, where n is an integer equal to or greater than three, underlying and electrically isolated from said clamping surface; and clamping control means for applying AC voltage to said electrodes when clamping of the workpiece is desired, the workpiece being electrostatically clamped in a fixed position on said clamping surface when said AC voltages are applied to said electrodes, said clamping control means comprising means for generating 2n bipolar square wave voltages having equally shifted relative phases, said square wave voltages defining n sets of square wave voltages, each of said sets including positive and negative, bipolar square wave voltages that are one half cycle out of phase, each of said bipolar square wave voltages having a predetermined switching speed selected to limit transients which could potentially damage the workpiece, and means for coupling said sets of square wave voltages to said electrodes so as to provide symmetrical clamping of the workpiece to said clamping surface.

27. Apparatus as defined in claim 26 wherein said clamping surface is defined by dielectric insulators, one for each of said electrodes, and said electrodes each comprise a metal layer formed on a lower surface of respective ones of said dielectric insulators.

28. Apparatus as defined in claim 27 wherein said dielectric insulators are fabricated from a material selected from the group consisting of alumina, sapphire and aluminum nitride.

29. Apparatus as defined in claim 27 wherein said dielectric insulators comprise alumina and said electrodes comprise a molybdenum layer and a thin titanium layer between said molybdenum layer and said dielectric insulator.

30. Apparatus as defined in claim 26 wherein each of said square wave voltages has a fundamental frequency in a range of about 20 Hz to 50 Hz.

31. Apparatus as defined in claim 30 wherein each of said bipolar square wave voltages has a peak amplitude in a range of about 900 volts to 1200 volts.

32. Apparatus as defined in claim 26 further including means for introducing a gas into a region between said workpiece and said clamping surface for conducting thermal energy between said workpiece and said clamping surface when said apparatus is utilized in a vacuum environment.

33. Apparatus as defined in claim 32 further including means for sealing the region between said workpiece and said clamping surface near an outer periphery thereof to prevent escape of said gas from said region.

34. Apparatus as defined in claim 26 further including means for cooling said platen.

35. Apparatus as defined in claim 27 wherein said electrodes comprise sector-shaped electrodes having equal areas, wherein said clamping surface comprises a dielectric material selected from the group consisting of alumina, sapphire and aluminum nitride, and wherein each of said square wave voltages has a fundamental frequency in a range of about 20 Hz to 50 Hz.

36. Apparatus for electrostatic clamping of a workpiece in a vacuum chamber, comprising:
   a platen having a circular, electrically insulating clamping surface for receiving a workpiece, said clamping surface being defined by six dielectric insulators, said platen further including six electrodes underlying said dielectric insulators and an insulating substrate for supporting said electrodes and said dielectric insulators;
   clamping control means for applying AC voltages to said electrodes when clamping of the workpiece is desired, the workpiece being electrostatically clamped in a fixed position on said clamping surface when said AC voltages are applied to said electrodes, said clamping control means comprising means for generating six bipolar square wave voltages having relative phases of 0°, 60°, 120°, 180°, 240° and 300°, said square wave voltages defining first, second and third sets of square wave voltages, each of said sets including positive and negative, equal amplitude, bipolar square wave voltages that are one half cycle out of phase, each of said bipolar square wave voltages having a predetermined switching speed selected to limit transients which could potentially damage the workpiece, and means for coupling said sets of square wave voltages to said electrodes so as to provide symmetrical clamping of the workpiece to said clamping surface;
   means for introducing a gas into a region between said workpiece and said clamping surface for conducting thermal energy between said workpiece and said clamping surface; and
   means for cooling said platen.

37. Apparatus as defined in claim 36 wherein said electrodes comprise sector-shaped electrodes having equal areas, wherein said dielectric insulators are fabricated of a material selected from the group consisting of alumina, sapphire and aluminum nitride, and wherein each of said square wave voltages has a fundamental frequency in a range of about 20 Hz to 50 Hz.

38. Apparatus for electrostatic clamping of a workpiece, comprising:
   a platen having an electrically insulating clamping surface for receiving a workpiece and 2n conductive electrodes, where n is an integer equal to or greater than three, underlying and electrically isolated from said clamping surface; and
   clamping control means for applying AC voltages to said electrodes when clamping of the workpiece is desired, the workpiece being electrostatically clamped in a fixed position on said clamping surface when said AC voltages are applied to said electrodes, said clamping control means comprising means for generating six bipolar square wave voltages having relative phases of 0°, 60°, 120°, 180°, 240° and 300°, said square wave voltages defining first, second and third sets of square wave voltages, each of said sets including positive and negative, equal amplitude, bipolar square wave voltages that are one-half cycle out of phase, each of said bipolar square wave voltages having a predetermined switching speed selected to limit transients which could potentially damage the workpiece, and means for coupling said sets of square wave voltages to said electrodes so as to provide symmetrical clamping of the workpiece to said clamping surface.

39. Apparatus as defined in claim 38 wherein said electrodes comprise sector-shaped electrodes having equal areas, wherein said clamping surface comprises a dielectric material selected from the group consisting of alumina, sapphire and aluminum nitride, and wherein each of said square wave voltages has a fundamental frequency in a range of about 20 Hz to 50 Hz.

* * * * *